United States Patent
Burns et al.

[11] Patent Number: 6,017,794
[45] Date of Patent: Jan. 25, 2000

[54] METHOD OF MAKING AMORPHOUS SILICON ON INSULATOR VLSI CIRCUIT STRUCTURES WITH FLOATING GATES

[75] Inventors: Stanley G. Burns, Ames, Iowa; Carl Gruber, Le Sueur, Minn.; Howard R. Shanks; Alan P. Constant, both of Ames, Iowa; Allen R. Landin, Boone, Iowa; David H. Schmidt, Ames, Iowa

[73] Assignee: Iowa State University Research Foundation, Ames, Iowa

[21] Appl. No.: 08/974,782

[22] Filed: Nov. 20, 1997

Related U.S. Application Data

[62] Division of application No. 08/319,752, Oct. 7, 1994, abandoned, and a division of application No. 08/751,785, Nov. 18, 1996, Pat. No. 5,742,075.

[51] Int. Cl.[7] ............................................... H01L 21/8247
[52] U.S. Cl. ......................... 438/258; 438/158; 438/675
[58] Field of Search .................................. 438/151, 157, 438/158, 164, 258, 637, 672, 675

[56] References Cited

U.S. PATENT DOCUMENTS

| | | | |
|---|---|---|---|
| 4,882,295 | 11/1989 | Czubatyj et al. | 438/158 |
| 5,041,884 | 8/1991 | Kumamoto et al. | 357/23.4 |
| 5,084,905 | 1/1992 | Sasaki et al. | 357/71 |
| 5,235,189 | 8/1993 | Hayden et al. | 257/329 |
| 5,274,602 | 12/1993 | Glenn | 365/239 |
| 5,332,686 | 7/1994 | Glenn | 438/158 |
| 5,334,539 | 8/1994 | Shinar et al. | 437/1 |
| 5,437,762 | 8/1995 | Ochiai et al. | 438/164 |

OTHER PUBLICATIONS

"Properties Of The Interface Between Amorphous Silicon and Nitride", by Tsai et al., Mat. Res. Soc. Symp. Proc. vol. 70, pp. 351–359, 1986.

"Defect States In Silicon Nitride", by Robertson et al., Mat. Res. Soc. Symp. Proc. vol. 49, pp. 215–222, 1985.

"The Origin of Slow States At The Interface Of α–Si:H And Silicon Nitride", by R.A. Street et al., Mat. Res. Soc. Symp. Proc. vol. 70, 1986, pp. 367–372.

"Hydrogenated Amorphous Silicon Thin–Film Transistor––Based Circuit Development For Use In Large Memories", by Stanley G. Burns et al., AMLCD Symposium, Lehigh University, Bethlehem, PA (Oct. 1993).

*Primary Examiner*—Chandra Chaudhari
*Attorney, Agent, or Firm*—Leydig, Voit & Mayer, Ltd.

[57] ABSTRACT

An integrated thin film transistor on insulator circuit made up of a number of thin film transistors formed with small feature size and densely packed so as to allow interconnection as a complex circuit. An insulating substrate, preferably flexible, serves as the support layer for the integrated circuit. Control gate metallization is carried on the insulating substrate, a dielectric layer is deposited over the control gate, and an amorphous silicon layer with doped source and drain regions deposited on the dielectric layer. Trenches are formed to remove the amorphous silicon material between transistors to allow highly dense circuit packing. An upper interconnect level which forms connections to the source and drain and gate regions of the thin film transistors, also interconnects the transistors to form more complex circuit structures. Due to the dense packing of the transistors allowed by the trench isolation, the interconnecting foils can be relatively short, increasing the speed of the circuit.

24 Claims, 12 Drawing Sheets

(a) SINGLE INVERTER (d) SRAM CELL (b) NOR GATE (c) R-S FLIP FLOP 6,017,794

METHOD OF MAKING AMORPHOUS SILICON ON INSULATOR VLSI CIRCUIT STRUCTURES WITH FLOATING GATES

This is a divisional of application Ser. No. 08/319,752 filed on Oct. 07, 1994, now abandoned, and Ser. No. 08/751,785 filed on Nov. 18, 1996 now U.S. Pat. No. 5,742,075.

The United States Government has certain rights in this invention pursuant to Contract No. MDA 972-92-J-1009 between Advanced Research and Project Agency of the Department of Defense and Iowa State University.

FIELD OF THE INVENTION

This invention relates to semiconductor technology, and more particularly to thin film transistor integrated circuits formed on an insulating substrate.

BACKGROUND OF THE INVENTION

Amorphous silicon has been used in semiconductor devices, but such devices have not enjoyed the popularity of more conventional monocrystalline semiconductor devices. Amorphous silicon semiconductors have the advantage of being fabricatable on flexible substrates, and thus present the possibility of formation on a number of different kinds of substrates, unlike the crystalline semiconductor substrate conventionally used. The non-crystalline properties of amorphous silicon semiconductors also present the opportunity for forming very large scale devices, since such devices are not limited by the crystal and die size limitations normally associated with crystalline semiconductors.

Amorphous silicon devices, however, possess a number of significant drawbacks. First of all, leakage through the amorphous semiconductor material is typically quite high, making it difficult to isolate one device from another. Switching speed and frequency response is not suitable for many applications. Amorphous silicon semiconductor devices have been utilized extensively in large scale solar cells, for example, where the tradeoff allowing large size and flexibility outweighs the disadvantages. Amorphous silicon devices have also been used in very large scale memories which were impractical of construction with conventional crystalline semiconductors. However, in the majority of situations, where requirements of switching speed and device size akin to current semiconductor technology are required, amorphous silicon devices have typically not been applied.

Even MOS devices, although not as fast as bipolar semiconductors, have been improved to realize relatively fast switching speeds. However, the physical structure of a MOS device has a very, very thin layer of oxide interposed between metallic electrodes and the doped surface of the silicon semiconductor material. The very small capacitance introduced by the very thin insulating layer (typically silicon dioxide) allows the voltage impressed on the electrodes to set up fields (depletion regions) in the semiconductor material just below the surface. However, equivalent devices are not possible in amorphous silicon for a variety of reasons. The end result is that typically, comparatively thicker layers of dielectric material are required to be interposed between the gate metallization and the amorphous silicon layer, whereas there is no requirement for insulation between the source and drain electrodes and the corresponding doped areas of the amorphous silicon transistor. This fundamental structural difference is in part responsible for the relative slowness in switching of amorphous silicon devices. However, that relative slowness has been tolerated because of the applications in which the devices have typically been employed.

Conventional semiconductor technology has progressed to very large scale integration which includes literally thousands of devices (transistors and the like) in a single circuit, and all of very small feature size. The approaches utilized in conventional semiconductor technology have not been applicable to amorphous silicon circuits for some of the reasons noted above. While it is generally appreciated that an extremely large number of devices is possible in amorphous silicon technology, because of the elimination of substrate size limitations, with the exception of solar cells and other relatively large feature size devices, the technology has not progressed in that direction.

SUMMARY OF THE INVENTION

In view of the foregoing, it is a general aim of the present invention to provide an integrated circuit formed in amorphous silicon semiconductor materials on an insulating substrate, the integrated circuit providing the possibility for ultra large scale integrated circuit devices.

In accomplishing the foregoing aim, it is an object of the present invention to provide amorphous silicon thin film transistor devices in small feature size and high density configurations, but configured to operate with the isolation and switching speed acceptable for integrated circuit applications.

In a specific implementation of that object, it is an object to provide an integrated circuit in thin film of a multi-bit memory cell configured in amorphous silicon on insulator technology, with the overall cell occupying only a limited amount of space, and capable of replication to provide a high density memory on a comparatively small substrate area.

It is also an object to provide the processing technology capable of forming highly dense integrated circuits in amorphous silicon on insulator, having integrated circuit characteristics superior to amorphous silicon devices provided in the past.

Other objects and advantages will become apparent from the following detailed description when taken in conjunction with the drawings, in which:

DETAILED DESCRIPTION OF THE PREFERRED EMBODIMENTS

While the invention will be described in connection with certain preferred embodiments, there is no intent to limit it to those embodiments. On the contrary, the intent is to cover all alternatives, modifications and equivalents included within the spirit and scope of the invention as defined by the appended claims.

Figure 1:
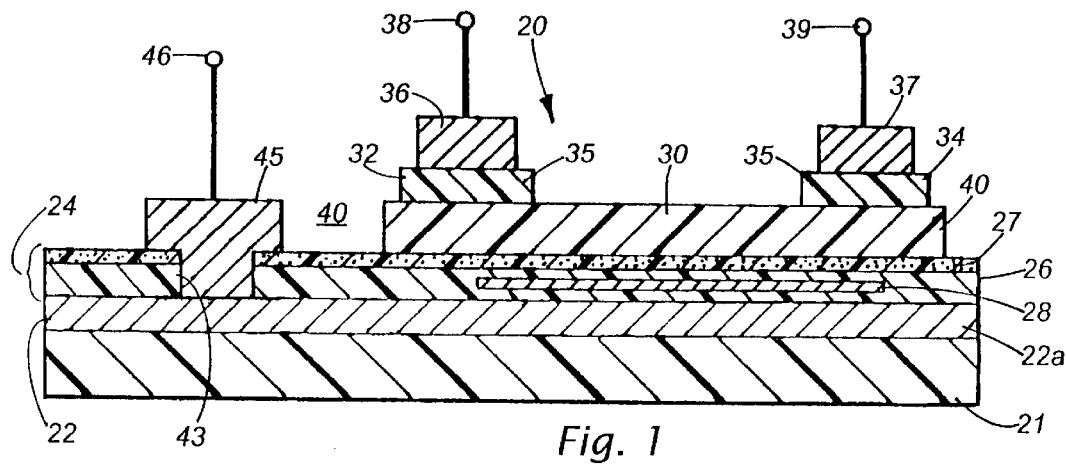
FIG. 1 is a cross-sectional representation of a floating gate thin film transistor constructed in accordance with the present invention.

Turning now to the drawings, FIG. 1 is illustrative of the present invention in that it shows a thin film transistor of small feature size and capable of high density packing in an integrated circuit. It will be appreciated by those skilled in the art that the layers shown as making up the thin film transistor are not drawn to scale, but are drawn to facilitate an understanding of the composite structure of the device.

The transistor 20 illustrated in FIG. 1 is a floating gate transistor formed on an insulating film 21, preferably a thin, flexible, polyimide film. A metallization layer 22 is formed on the film and patterned to form a control gate 22a for the transistor device and also to form interconnections to other circuitry in the device. Deposited on the metallization layer 22, which is preferably of chromium, is a dielectric layer 24. In the illustrated embodiment, the dielectric layer 24 is a composite layer comprising a first high resistivity component 26 covered by a second component 27 adapted to provide an appropriate interface with the amorphous silicon semiconductor material. Embedded within the dielectric layer is a floating gate 28. In the preferred practice of the invention, the lower component 26 of the dielectric layer 24, that is, the component which encapsulates the floating gate 28, is of high resistivity dielectric material, on the order of $10^{17}$ ohm-cm or higher. Silicon dioxide is preferred for this application, since it has a resistivity of between $10^{17}$ and $10^{18}$ ohm-cm. The upper component 27 of the dielectric layer is a layer which is appropriate for interface with an amorphous silicon semiconductor material. In the FIG. 1 embodiment, the upper component 27 of the composite dielectric layer 24 is of silicon nitride. It is clearly preferred to avoid silicon dioxide in the interface layer, since the oxide creates interfacial defects with the amorphous silicon, and such defects tend to trap carriers and thereby degrade the characteristics of the transistor. Silicon nitride is found to interface with a minimum of created interfacial defects, and thus is preferred as the interface between the high resistivity dielectric and the amorphous silicon. The use of silicon nitride for the entire layer, however, is to be avoided since the resistivity thereof is inadequate to store the charge in the floating gate for a sufficiently long time.

Deposited on the dielectric layer 24 is an α-Si:H layer 30 which serves as the semiconductor material for the thin film transistor. The amorphous silicon layer 30 has formed thereon doped regions 32, 34 which serve as the source and drain for the thin film transistor. The region 35 between the source and drain regions 32 is the transistor channel. In accordance with the invention, the channel 35, which is typically the minimum dimension component of a thin film transistors, is on the order of 5 microns or less. It is presently preferred to utilize a minimum dimension of 2 microns, although with superior lithographic and associated equipment, the minimum dimension can be reduced still further, perhaps by an order of magnitude.

Metallic contacts 36, 37 are deposited over the source and drain regions 32, 34. The contacts 36, 37 are shown as being available for interconnects at 38, 39 for connection to outside circuitry, or to other devices in the structure.

In accordance with an important aspect of the invention, a trench area 40 is provided around the thin film transistor layer, and penetrates through the amorphous silicon layer 30. The trench 40 at the left-hand side of the transistor of FIG. 1 is shown penetrating to the upper surface of dielectric layer 27, which is the preferred construction. The area over the exposed dielectric is normally filled with an insulating material, such as silicon dioxide, although that layer is not used in FIGS. 1 and 2. A via 43 is etched to reach the chrome contact layer 22, and a metal contact 45 formed in the via 43 to serve as a gate electrode schematically illustrated at 46.

It will be appreciated that FIG. 1 shows only the features of one transistor device. Considering that the dimension 35 between the source and drain regions is on the order of 2 microns, it will be appreciated that the device as a whole occupies only a very limited portion, on the order of 100–200 square microns, of the substrate surface. It will therefore be appreciated that a large number of similar devices can be formed in a rather small area, and connected at an upper metallization layer to form more complex building blocks, and the building blocks interconnected to form more complex circuitry. Indeed, with the adaptability provided by amorphous silicon formed on large insulating substrates, this technology readily progresses beyond very large-scale integration into the next stage, which can be considered ultra-large scale integration.

Figure 2:
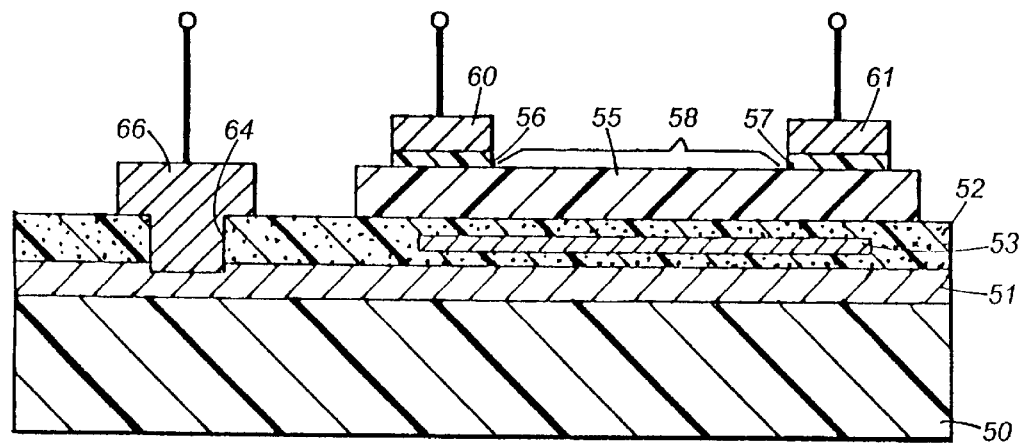
FIG. 2 is a view, similar to FIG. 1, representing an alternative configuration of the invention.

Turning then to FIG. 2, there is shown an alternate form of a floating gate thin film transistor constructed in the practice of the present invention. FIG. 2 illustrates a floating gate transistor, not unlike the floating gate transistor of FIG. 1, but utilizing a different dielectric structure. Thus, the floating gate transistor of FIG. 2 is also formed on a thin insulating substrate 50 having a metal contact layer 51 formed thereon, the metal contact layer 51 being patterned to form a control gate structure for the floating gate transistor. A dielectric layer 52 is formed over the control gate layer 51. In contrast to the composite dielectric layer 24 of FIG. 1, the dielectric layer 52 of the FIG. 2 embodiment comprises only a single component of suitable dielectric material. The composite dielectric layer of FIG. 1 as noted above had two components, one high resistivity component to reduce leakage from the floating gate, and a substantially oxide-free component which provided an appropriate interface characteristic for the amorphous silicon. In the FIG. 2 embodiment, both of those requirements are satisfied by a single dielectric material for the layer 52. That dielectric layer is preferably an aluminum nitride layer which is formed to have adequate resistivity (on the order of $10^{17}$ ohm-cm), to prevent leakage from the floating gate, and also being sufficiently free of oxide to form appropriate surface states with the amorphous silicon semiconductor layer. As in the prior embodiment, a floating gate 53 is formed in the dielectric layer 52. Amorphous silicon layer 55 is deposited over the dielectric layer 52. Doped source and drain regions 56, 57 are formed on the amorphous silicon layer 55. The doped amorphous silicon layers define a region 58 between the source and drain regions 56, 57 which is the channel for the device. Metal contacts 60, 61 formed over the source and drain regions 56, 57 provide for interconnection to the remainder of the circuitry. FIG. 2 shows a via 64 etched directly in the aluminum nitride, and penetrating to the contact layer 51. A metal contact 66 formed in the via 64 serves as the gate connection for the device.

It will also be appreciated that a thin film transistor structure to serve as a switching transistor (as opposed to the memory device of the floating gate transistor) is readily formed as in the FIG. 1 and FIG. 2 embodiments, simply by eliminating the process steps which form the floating gate 28 or 53. The remaining transistor structure for normal thin film transistor will then be identical to that shown in FIG. 1 or FIG. 2, with the elimination of the floating gate.

The floating gate thin film transistor has the ability to function as a memory device. When the control gate of the floating gate transistor is brought to a programming potential, the state of charge at the floating gate will be controlled by the state of conduction of the source-drain region, which in turn will be a function of whether a data 1 or data 0 is to be stored. When the programming voltage is removed, the charge is stored on the floating gate, and can be read out (as a 1 or a 0) when appropriate addressing signals are provided. Programming is accomplished, not only by applying programming voltages to the control gate, but also by applying "programming" voltages (either positive or negative) to the bit lines, causing the device to conduct in saturation, and causing either the storage of electrons at the floating gate, or the removal of previously stored electrons from the floating gate, and thereby altering the threshold characteristics of the floating gate transistor. The floating gate is embedded in a high resistivity material, such that the charge collected at the floating gate is stored for a long period of time, on the order of months or more, and thus the threshold characteristic of the floating gate transistor is a function of the charge stored on the floating gate during the programming operation. When it is desired to read the information out of the device, the address lines are activated, and conduction through the floating gate transistor will either be above or below the predetermined threshold, depending on whether or not a programming charge is stored on the floating gate. Discrimination above or below the threshold allows the determination of a 1 or a 0 for the information stored in the bit of the memory represented by the floating gate.

Figure 3:
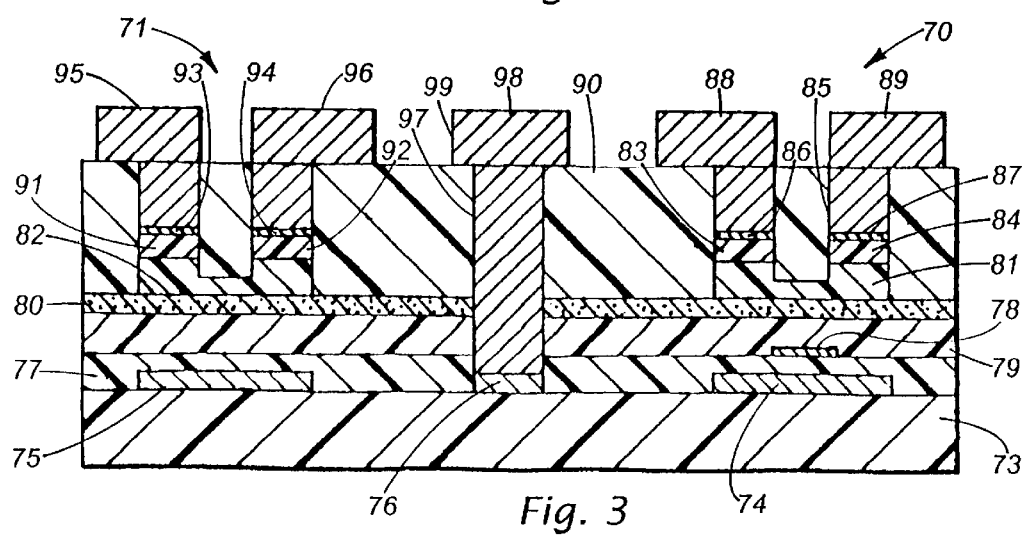
FIG. 3 is a diagram illustrating a substrate carrying a thin film transistor and a floating gate thin film transistor and exemplifying the present invention.

FIG. 3 is intended to illustrate the physical configuration of a more complex thin film transistor circuit, in that it shows both a floating gate transistor 70 having the characteristics described in connection with FIG. 1, and a thin film transistor 71 configured as a switching (rather than storage) device. The thin film transistor devices 70, 71 are representative of numerous such devices, which can be floating gate transistors, ordinary transistors, diodes, and any other device which can be configured by appropriately forming and connecting semiconductors in thin film transistor technology. Thus, the illustration of FIG. 3 can be considered to be representative of a large scale, a VLSI, or even a ULSI integrated circuit.

With that in mind, the circuit is formed on a large insulating substrate 73, preferably a polyimide sheet. A first layer metallization is formed on the insulating substrate, and is patterned by lithographic and etching techniques to form control gates 74, 75 for the respective transistors 70, 71. The metallization layer is also patterned to form interconnects between certain of the elements, such as the interconnect 76 which connects the control gate of one or both of the transistors 70, 71. Typically, the pad 76 will be connected to one of the gates, such as the gate 74, and another similar pad will be positioned elsewhere on the substrate, to form a contact pad for operation of the control gate 75.

Deposited over the metallization is a first dielectric layer 77 which is common to the entire circuit and covers the entire metallization pattern. In the case of floating gate transistors, there is formed over the dielectric layer 77 a further metallization layer 78 which is patterned to form floating gates 78 for the floating gate transistors. A subsequent dielectric layer 79 is then deposited over the floating gate metal 78 (where present) or simply over the initial dielectric layer 77 (where the floating gate is not present), to form a composite dielectric layer. When the dielectric layer configuration of FIG. 1 is utilized, both of the layers 77 and 79 will be a silicon dioxide insulator, so that the floating gate 78 will be encapsulated in a very high resistivity material. Deposited over the dielectric layer 79, in the preferred embodiment, is a further dielectric layer 80, preferably silicon nitride, intended to provide an adequate interface to amorphous silicon semiconductor material to be deposited thereon. The amorphous semiconductor material is represented by regions 81, 82, which are preferably undoped amorphous silicon intended to receive a doped layer patterned to form source and drain regions with a channel therebetween. Considering first at the floating gate transistor 70, source and drain regions 83, 84, formed of doped amorphous silicon material, are deposited on the amorphous silicon layer 81, defining a channel 85 therebetween. Metallization, preferably chromium, is deposited on the source and drain regions 83, 84 to form metal contacts 86, 87 for connection to the source and drain of the transistor. An upper layer of metallization is deposited to form an electrical contact with the metal contacts 86, 87, and to ultimately form contact pads 88, 89 for the source and drain. An insulating layer of material such as silicon dioxide is represented at 90. It is seen that the insulating layer 90 completely surrounds the amorphous silicon transistor layer 81, and thus serves as a barrier between the device 70 and any closely adjacent devices. The formation of a trench layer filled with insulating material 90 around the individual devices will be described in greater detail below. For the moment, suffice is to say that the trench, which is formed by removal of the amorphous silicon semiconductor material, is a significant feature in preventing cross talk or interference from one device to another.

Turning to the non-memory transistor device 71, it will be seen that formed over the amorphous silicon region 82, which is adapted to provide a channel between source and drain, are a pair of doped regions 91, 92 serving as the source and drain with chromium metallization layers 93, 94 deposited thereon, and contacts 95, 96 in electrical contact with the chromium layers 93, 94. The same insulating material 90 which surrounds the device 70, also surrounds the device 71. The trenches which are formed around the device 70 are formed at the same time as the trenches which surround the device 71, and all other devices on the substrate which are intended to be trenched.

For purposes of illustrating a control gate and its connections to the outside world, the metallization area 76, which in the present example is said to represent the contact for the control gate 74, is made accessible to the surface of the semiconductor device by way of a via 97 etched through the device and reaching the chromium contact region 76. Metallization 98 is deposited in the via 97 and forms a pad 99 over the surface of the insulating layer 90 to allow electrical contact to the gate of the floating gate transistor 70.

FIGS. 4A–4D indicate schematically the manner in which a relatively small number of transistors in the configuration suggested by FIG. 3 can be interconnected to form basic logic building blocks. In turn, the logic building blocks can be interconnected to form more complex circuits, and those circuits interconnected for VLSI and ULSI applications.

Figure 4A:
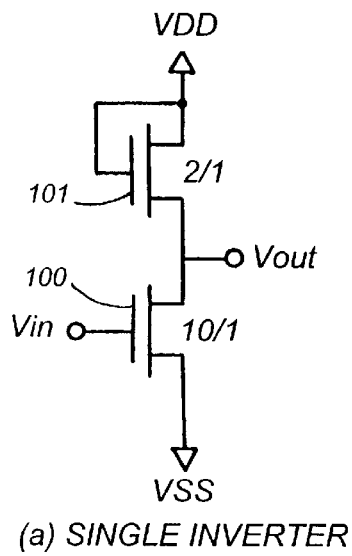
FIGS. 4A–4D are schematic diagrams representing different logic circuits constructed with thin film transistors in the practice of the present invention.

Turning to FIG. 4A, there is shown the schematic form of a single inverter which is comprised of two transistors 100, 101. The transistors have been formed with 5 micron minimum feature size (gate width) and with two micron minimum feature size. It is believed that smaller feature sizes are also achievable with improved lithographic equipment. The ratio shown next to the transistor indicates the gate length to width ratios for the thin film transistors. It is known that these ratios are a measure of current capacity of the transistors, and knowledge of the relative proportions is useful for understanding the functionality of the circuit building block.

It is seen that the transistor 101 is connected to serve as an active load for the inverting transistor 100. The positive supply $V_{DD}$ is connected to the source of the transistor 101 and the negative supply (typically ground) $V_{SS}$ is connected to the drain of the transistor 100. A positive input signal at $V_{in}$ causes the transistor 100 to conduct, resulting in a low $V_{out}$. A logic low $V_{in}$ renders the transistor 100 nonconducting, resulting in a logic high $V_{out}$. The transistor 101 serves as an active load for the transistor 100. It will be appreciated that the two transistor device illustrated in FIG. 3 (without the floating gate for the transistor 70) can be interconnected directly to form the circuit of FIG. 4A.

Figure 4D:
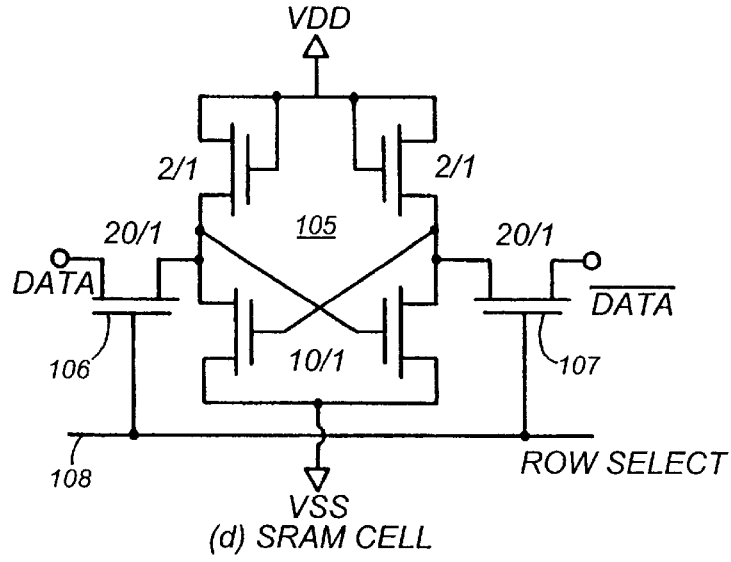
Figure 4B:
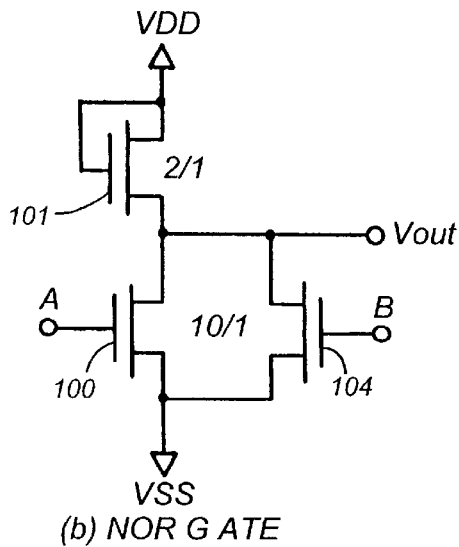

FIG. 4B illustrates the extension of FIG. 4A into a NOR gate. The transistors 100, 101 are like those in the inverter. A further transistor 104 is added in parallel with transistor 100. Thus, if a high input is applied to the control gate of either the transistor 100 or 104, the result will be a low logic output at $V_{out}$. Only when both inputs 100, 104 are low will the $V_{out}$ be high.

Figure 4C:
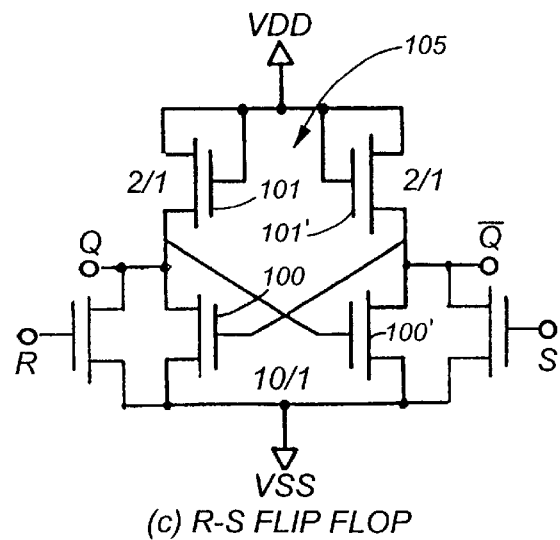

FIG. 4C illustrates the extension of the inverter of FIG. 4A (and the NOR Principle for FIG. 4B) into a conventional S-R flip-flop. The reference numerals applied to FIG. 4C indicate a pair of inverters, the first of which is identified by transistors 100, 101 and the second of which is identified by transistors 100', 101'. The transistors are cross-coupled as by connecting the source of one pair to the control gate of the other, so that the inverters will always be in the opposite state. Q and Q outputs are provided, and allow a means for toggling the transistor to its opposite state.

FIG. 4D illustrates the extension of the flip-flop of FIG. 4C to a static RAM cell. A basic S-R flip-flop is indicated at 105 comprised of a transistor arrangement as illustrated in connection with FIG. 4C. In addition, a pair of switching transistors 106, 107 are connected to what had been the Q and Q outputs of the flip-flop. The control gates of those transistors are driven from a row select line 108, so that the transistors are conductive only when the row select line is active. Thus, whenever the row select line is active, information can be transferred into or read out of this RAM cell where the storage mechanism is the flip-flop 105. It will be appreciated that the basic RAM cell is configured from only 6 transistors, two inverters as shown in FIG. 4A, and a pair of switching transistors connected as shown.

The manner of making the interconnections between transistors in a lower or upper metallization layer in the structure of FIG. 3 will now be apparent to one skilled in the art. The diagrams of FIGS. 4A–4D illustrate the utility of this basic thin film transistor on insulator technology in configuring building block circuit functions, which in turn can be configured into large scale circuits as desired. One of the features of the invention which will not be apparent from the FIGS. 4A–4D implementations (but which will be emphasized in connection with FIGS. 5A and 5B), is the trenching between devices. When configuring devices in amorphous silicon on insulator to produce the functionality shown in FIGS. 4A–4D, it will be necessary to trench around each of the logic devices, to reduce leakage between the devices and improve isolation between the devices, so that large-scale circuitry can be configured for reliable performance in a relatively small size.

Figure 5A:
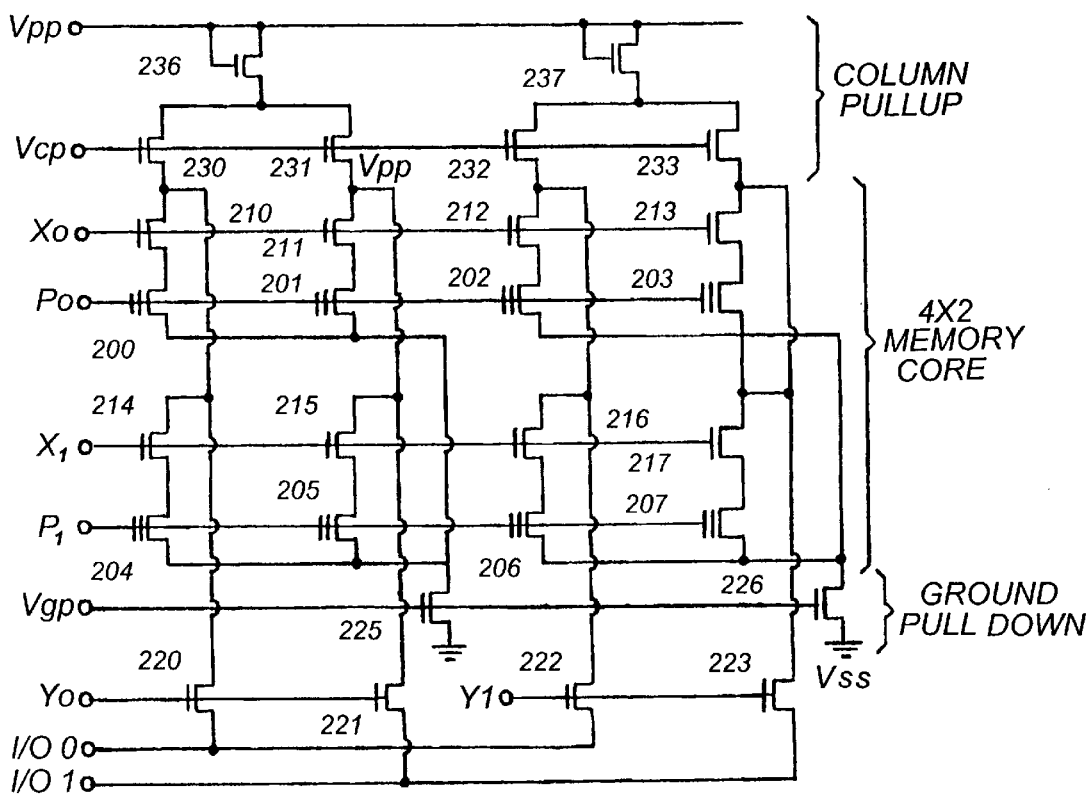
FIG. 5A is a schematic diagram of a 4×2 EEPROM representing one implementation of a complex circuit building block constructed in accordance with the present invention.
Figure 5B:
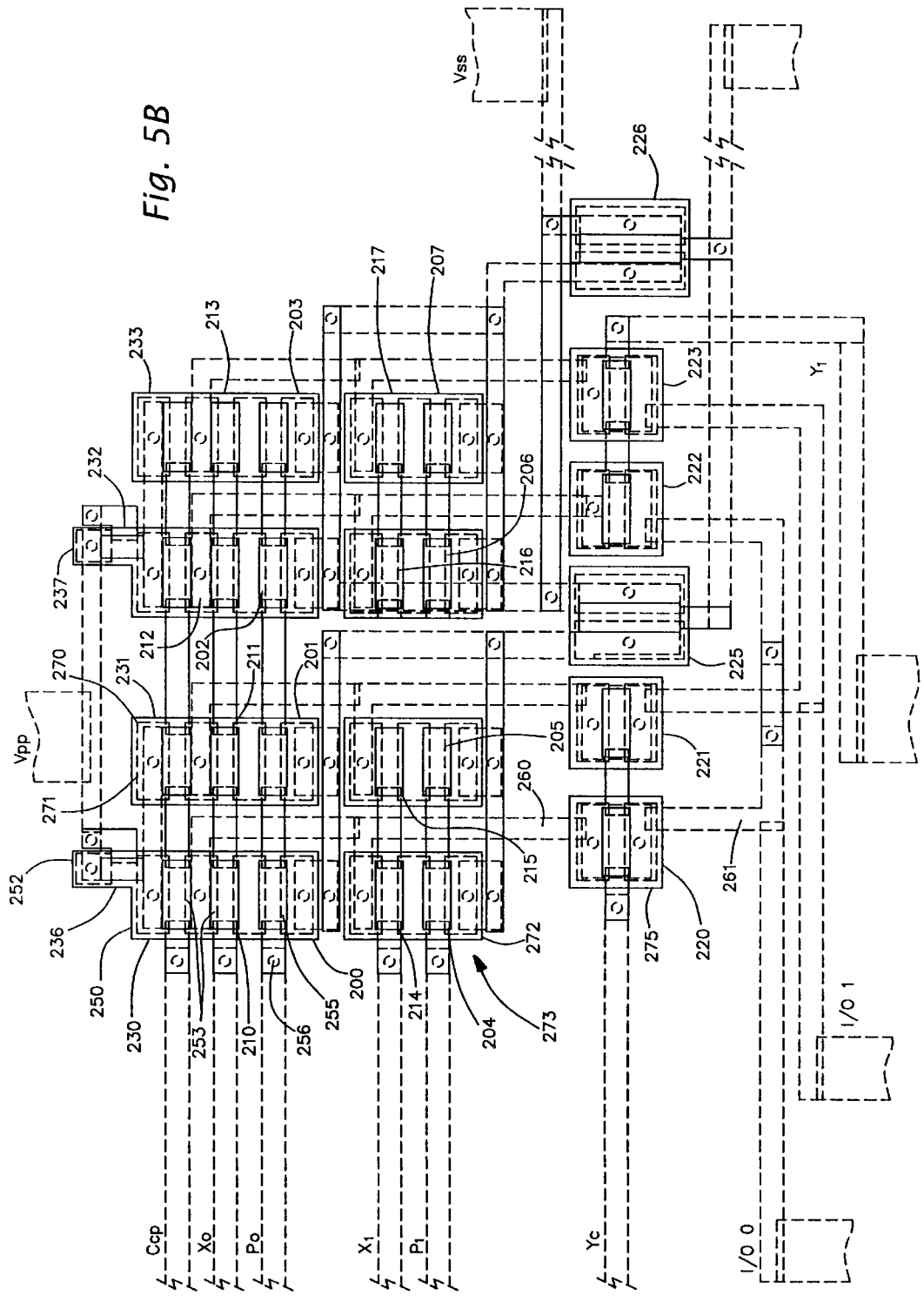
FIG. 5B is a layout illustrating the semiconductor structure of the complex circuit of FIG. 5A.

Turning to FIGS. 5A and 5B, there is shown, in schematic form and in physical configuration, respectively, a complex integrated circuit comprising a plurality of thin film transistors, making up a building block which can be replicated numerous times to form a VLSI or ULSI integrated circuits. The circuit has 8 memory cells, and the interconnecting and addressing scheme configure the 8 memory cells as a 4×2 memory. The memory functions as an electrically erasable PROM, and therefore it would be appreciated that the circuit whose schematic is illustrated in FIG. 5 and whose semiconductor structure is illustrated in FIG. 5B, can function as a 4×2 EEPROM memory module. Such modules can be interconnected to form large memory arrays to suit a wide variety of applications. Due to the fact that the memories can be formed on insulating substrates having characteristics not limited by monocrystalline silicon technology, very large memories, and control circuits for those memories, can be configured.

Turning to the schematic first for an understanding of the logic cell, there is shown a 4×2 bit EEPROM. Thus, there are 8 memory cells in the device, and they are in the form of floating gate thin film transistors 200–207, each capable of storing 1 bit. Each storage transistor has a switching transistor 210–217 associated therewith for purposes of addressing. Thus, the transistors 210–213 are all connected to an $X_0$ address, so that all of the associated storage transistors can be addressed with $X_0$ brought high. Similarly, the transistors 214–217 are associated with a $X_1$ address, so that all of the associated floating gate transistors can be addressed when $X_1$ input is high. For purposes of input/output, a further transistor arrangement is provided including transistors 220–223. When the $Y_0$ signal is brought high, the transistors 220 and 221 conduct, connecting the sources of all of the transistors 210, 211, 214 and 215 to the respective I/O line, $I/O_0$ and $I/O_1$. In that case, the $I/O_0$ line is connected to both the floating gate transistors 200 and 204, such that one of those transistors, depending on whether the $X_0$ or $X_1$ signal is high, will be connected to the input/output line. The pair of transistors 201, 205 function in a similar manner when the $Y_0$ input/output line is high. The transistors 222 and 223 are connected to similar cells so that they function in a similar fashion when the $Y_1$ signal is brought high.

Programming signals $P_0$ and $P_1$ are connected to the control gates of the floating gate transistors. Thus, the conductor which connects the programming voltage $P_0$ to the array is connected to the gates of transistors 200–203 to control programming of those transistors. Similarly, signal $P_1$ is connected to the control gates of floating gate transistors 204–207 to control programming of those transistors. A pair of transistors 225, 226 are connected between the drains of all of the floating gate transistors and circuit ground. A signal $V_{gp}$ controls the transistors 225 and 226 both for a timing signal for programming of the devices and also as a readout signal. Whenever $V_{gp}$ is high, all of the drains are connected to circuit ground, so that there is a path for conduction through any of the devices which are selected by appropriate addressing signals.

Turning to the top of the schematic, an active load is represented by transistors 236, 237. Those transistors are connected to be biased on, since both the source and gate are connected to the positive supply $V_{pp}$. A current will flow through those transistors when the circuit is completed through one of the memory cells and an associated pulldown transistor 225 or 226.

A further set of control transistors 230–233 are provided for connecting the active loads 236, 237 to the memory cells below them. It will be seen that the drain of transistor 230, for example, is connected to the source of the switching transistor 210 and also to the source of the switching transistor 214. The connection is also made to the source of the input/output transistor 220, such that input/output information can be conveyed to or from the associated cell when the transistor 230 is turned on by application of a high voltage to its gate via signal $V_{CT}$.

Focusing on just one of the cells, that containing the floating gate memory unit 200, the operation of each of the cells will be described. When it is desired to program the bit associated with memory transistor 200, a logic 0 is written by connecting the I/O line to a high voltage. That high voltage is applied to the source of transistor 210 by turning on of transistor 220 at the appropriate time in the programming cycle. At the same time, the program line $P_0$, connected to the control gate of the floating gate transistor 200, is brought to ground, and the word select line $X_0$ (along with $Y_0$) is brought to a logic high. It is important to keep $X_1$ at a logic low in order to prevent unwanted programming of another cell. With the cell biased as described, electrons will tunnel to the floating gate, causing the collection of charge at the floating gate, and setting that bit at a logic 0. A logic 1 is written in a similar fashion, with the exception that the bit line (that connected to the I/O line) is connected to a negative voltage (while grounding the program line and properly biasing the word select line $X_0$). That set of bias conditions will remove electrons from the floating gate, setting the bit to a logic 1.

For the read operation, the program line for the cell is left high. A cell is addressed by bringing its associated address line $X_0$ to the high state. The I/O line is connected by bringing the signal $Y_0$ to the high state. When the readout and timing pulses $V_{cp}$ and $V_{gp}$ are applied to the associated transistors, the active load 236 will be connected to the associated cell. If a logic 0 had been stored on the floating gate of transistor 200, the transistor 200 will not conduct heavily, leaving a logic high at the source thereof, the logic high being conducted through the switching transistor 210 and the readout transistor 220 to the $I/O_0$ line. Contrarywise, if the cell 200 had been programmed with a logic high, when the address select signal is applied to the transistor 210, the transistor 200 will conduct more heavily, causing a low signal at the drain of the transistor 210, which will be passed through the transistor 220 to the output line $I/O_0$.

That basic operation applies to each of the individual cells. However, in the structure of FIG. 5, the cells are addressed in groups, so that the EEPROM functions as a 4×2 bit array. The 2 bits are segregated by connection to the I/O lines 0 and 1, respectively. When $X_0$ and $Y_0$ are both high, for example, the bits stored in floating gate transistors 200 and 201 are read out onto $I/O_0$ and $I/O_1$, respectively.

Similarly, when the $X_0$ line is high but the $Y_1$ line is high, the bits stored in floating gate transistors 202 and 203 will be read out onto the same $I_0$ lines. Those skilled in the art will appreciate the addressing scheme is capable of individually reading out each 2 bit cell in dependence on the $X_0$, $X_1$, $Y_0$ and $Y_1$ logic states.

The manner in which the schematic diagram of FIG. 5A is configured in a relatively small area of semiconductor material is illustrated in connection with FIG. 5B. The reference numerals utilized with the transistors in the schematic of FIG. 5A are also applied to the circuit of FIG. 5B. It is seen that some of the devices use common source and drain for multiple transistors. Thus, for example, a circuit device 250 is provided which contains both the control transistor 230 as well as the memory transistor 200 and addressing transistor 210 for the first cell. It will be seen that the active pullup transistor 236 is also closely associated with the device 250. In practicing the invention, a trench is provided around that device, the trench being illustrated by the solid line 252 enclosing the devices 250 and 236. The solid line 252 indicates the removal of the material to the dielectric layer, and the replacement of those possible leakage paths with a good insulator such as silicon dioxide. The upper metallization layer is then formed upon that silicon dioxide layer.

It is difficult to see the various layers of the device of FIG. 5B, but different forms of lines have been used in an effort to assist. The control gates for the transistors 230 and 210 are formed at the lowest metallization layer, the control gates being indicated at 253. It will be seen that the lower metallization layer also continues with connections to the other control gates in that horizontal row of transistors. The floating gates for the memory transistors 200–207 are indicated as rectangles between associated source and drain regions. For example, the transistor 200 has a floating gate region indicated at 255. It will be appreciated that underlying the floating gate is also a control gate (not seen in FIG. 5B), to which the connecting conductor $P_0$ (formed in the upper metallization layer) is connected by way of a via 256.

Each of the cells is formed as shown in the diagram and as generally described above. Those skilled in this art will appreciate that the vias interconnecting the top layer metallization with lower level metallization (or with the intermediate level such as the chrome contacts for the source and drain) are made at multiple points along the conductor to assure good connection and a well-distributed current characteristic. The multiple connections are not shown in FIG. 5B in order to avoid confusing the drawing.

The lower bank of transistors represents the control transistors. It will be seen that the transistor 220 has a source connected by an upper metallization foil 260 to the source regions of transistors 210 and 214. It will be recalled that the transistor 220, when conductive, is the transistor which connects the addressed source of the memory cell to the input/output bus (shown connected by an upper metallization conductor 261 to the drain of transistor 220).

Without detailing each of the connections of the circuit of FIG. 5B, a comparison of FIG. 5B with FIG. 5A will reveal to those skilled in this art that indeed the circuit function of FIG. 5A is accomplished by the transistor layout shown in FIG. 5B. Attention will now be directed to the trenching around the individual devices which allows the close packing as shown in FIG. 5B. In addition to the trench 250 discussed above, each of the other cells has a similar trench, such as trench 270 associated with the cell 271, trench 272 associated with the cell 273, etc. Indeed, each of the control transistors are also trenched, a trench 275 being associated with the switching transistor 220, for example. The solid line blocks around each of the transistors indicate such trenching in the form of removal of the amorphous silicon material between the devices to prevent leakage between such devices.

With respect to relative size, the logic element of FIG. 5B has been implemented in 2 micron minimize size technology, which represents 2 micron gate widths, i.e., the region between the source and drain, for example, of each of the transistors. With that configuration, the interconnecting foil such as conductor 260 are on the order of 4 microns, and the major foils, such as that bringing $V_{PP}$ to the circuit are on the order of 20 microns. With respect to length-to-width ratios for the transistors, the active pullup transistors 236, 237 have a ratio of 4:4, whereas all of the other transistors including the switching transistors and the floating gate transistors have length-to-width ratios of 20:2.

The basic unit cell as shown in FIG. 5B can be replicated numerous times to form other configurations, such as 8×8 configurations for 64 memory cells, and the 64 cell memory can be replicated numerous times to form mega bites and giga bites of active memory which can be readily written and read by appropriate control of the programming and addressing voltages all as described in detail above in the simple case.

Figure 6:
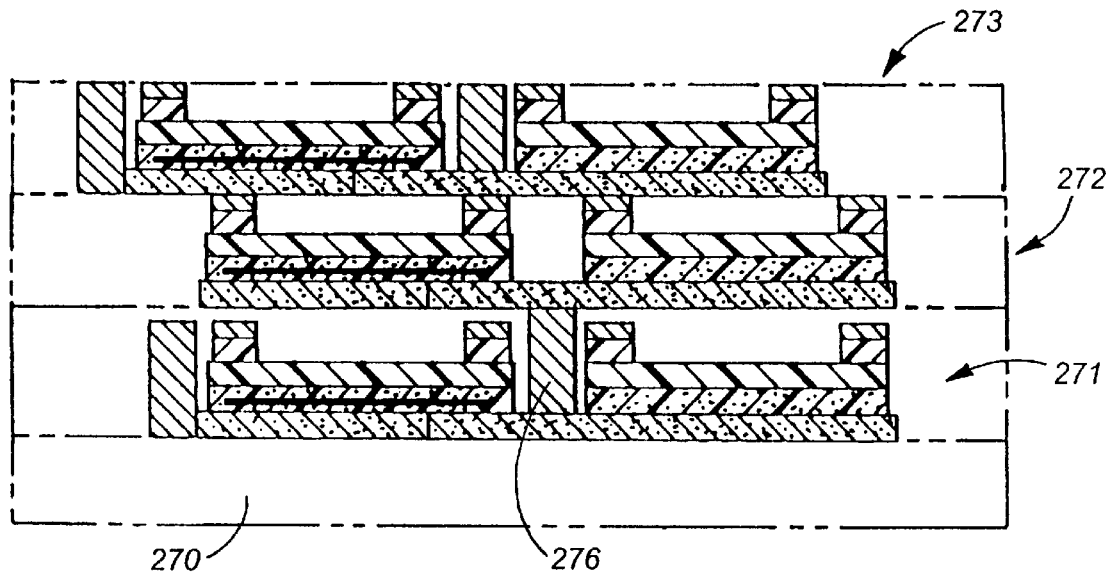
FIG. 6 is a diagram showing a multi-layer device constructed in accordance with the present invention.

Turning to FIG. 6, there is shown a multi-layer amorphous silicon on insulator configuration constructed in accordance with the present invention. An insulating substrate 270, such as a polyimide film, serves as a support for the device. A first layer 271 of thin film transistor circuitry is formed on the polyimide film 270 as described above. In contrast to the prior steps, after formation of the thin film transistors on the first layer 271, a spin-on coating of insulating material, such as a polyimide, is applied to the surface of the first layer. The spin-on technique provides a relatively flat surface. Additional patterning can be done for vias and the like, following which the base metal for a second layer 272 is applied. After the second transistor layer 272 is completed, a further spin-on insulating layer is applied, and a further layer 273 formed on it. Vias are used to interconnect between the layers as illustrated in FIG. 6. For example, the base metal layer of the lowest level 271 is connected to the base metal layer of the intermediate level 272 by a via 276. The source and drain regions of the transistors making up the layer 271 are interconnected among each other, but there is no connection shown to the next superior level, at least in the area illustrated. Other vias will make such connections. For example, in the layer 272, contacts are made between both the source and drain of the leftmost transistor with the lower metallization layer in the next superior level 273.

It will be seen that each of the transistors comprising each of the layers is formed with trench isolation surrounding it, such that a packing density can be enhanced without the leakage and other defects normally associated with amorphous silicon technology. Furthermore, the polyimide insulation between layers also prevents leakage from layer to layer, thus providing a very highly dense and easily interconnectible circuit readily configured as a ULSI device. The low temperature processing described in detail below is a significant factor in allowing for this multi-layer fabrication without damaging already fabricated layers when fabricating additional layers.

Figure 7:
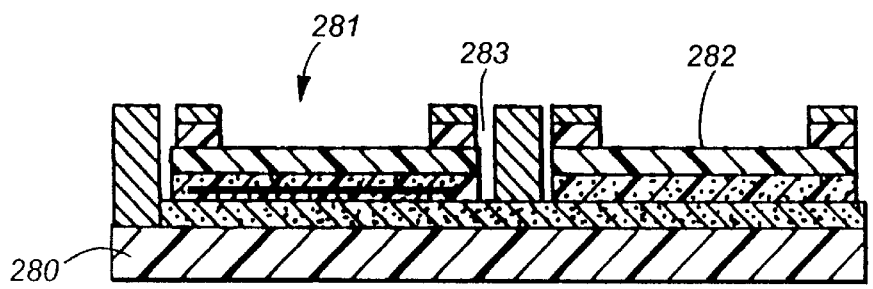
FIG. 7 represents a multi-layer device in an alternative laminated structure.
Figure 7:
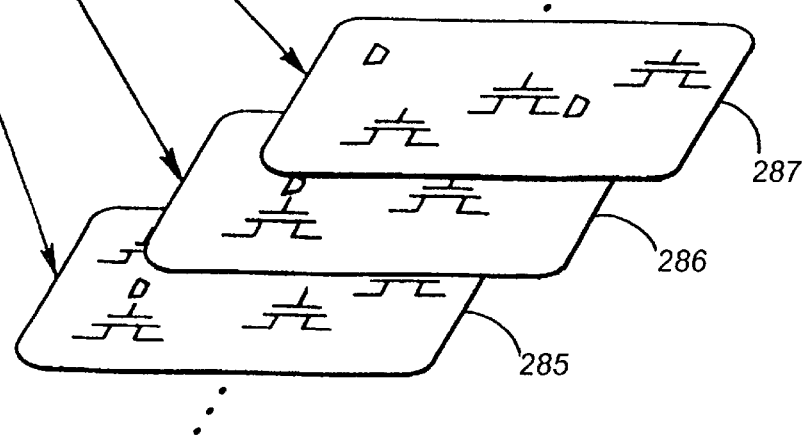

FIG. 7 illustrates another form of multi-layer device. The lower portion of FIG. 7 illustrates in cross section a polyimide substrate 280 carrying a pair of floating gate transistors 281, 282, separated by trench isolation generally indicated at 283, and having the necessary metallization for interconnections and the like. The lower portion of FIG. 7 indicates a plurality of such devices, but shown in schematic fashion. A circuit layer such as layer 280 on its own polyimide substrate is formed to produce each of the layers 285, 286 and 287 with circuit devices and vias as roughly illustrated in those semiconductor layers. Each layer will typically have its own configuration of transistors and interconnections, and there is no requirement that the layers, circuit-wise, be identical. Each of the layers is individually and independently formed, and subsequently, all of the layers are brought together in registration and laminated together to form a single multi-layer device.

Thus, FIGS. 6 and 7 show two techniques for forming a multi-layer device in accordance with the present invention, one of which forms the layers independently, and the other of which produces them one on the other in sequence.

Figure 8:
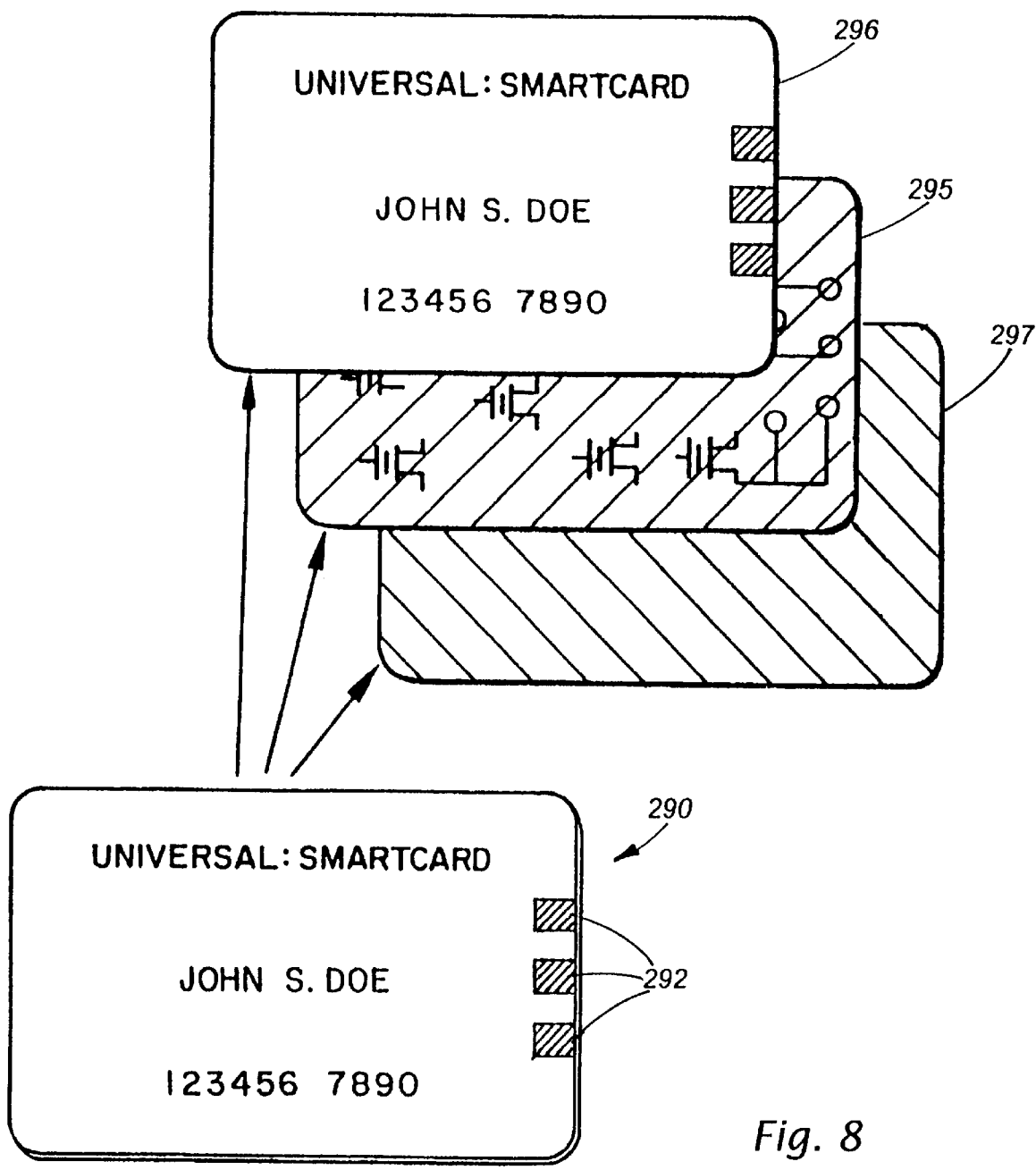
FIG. 8 is a diagram illustrating the utilization of the invention in an electronic memory in the form of a wallet-size data card.

FIG. 8 shows a practical implementation of the invention as a universal data card 290 carrying a large quantity of active read/write memory. The card can be used, for example, as a credit card or debit card. Contacts 292 on the card provide for electrical connection of the card to a teller machine or terminal. The contacts 292 are representative of a broader range of means for transferring information to or from the memory cells in the data card. A transaction can then be accomplished using the terminal and the information stored in the card. The card itself is based primarily on an intermediate layer 295 of thin film transistor circuitry formed on an insulating substrate in accordance with the present invention. In certain cases, multiple layers of thin film transistor circuitry can be combined in a simple data card. While only a small number of devices are schematically shown on the layer 295, they are intended to represent a large memory and interfacing circuits for addressing and storing information about the card holder and his account. All of the cards for a given bank will, of course, be made identically, and programming accomplished after manufacture of the card. The thin film transistor layer 295 on an insulating substrate is laminated between layers 296 and 297 of conventional plastic material to present an overall appearance of a credit card. Identifying data can be carried on the face of the card as illustrated in the drawing.

When the card is issued, it is inserted in an appropriate card issuing machine, and areas of memory programmed with the name of the holder, a pin number, account balances, and the like. Each time a transaction is made, the card is inserted in a terminal and the thin film transistor memory is read out in order to obtain the appropriate information. A transaction is made and thereupon the terminal rewrites certain sections of the memory in the card layer 295, following which the card is removed from the machine and available for another transaction.

Figure 9:
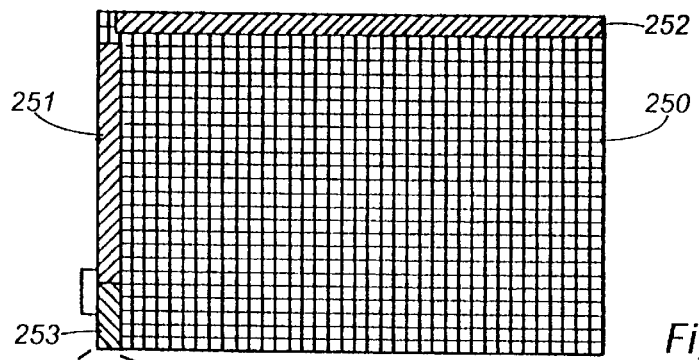
FIG. 9 is a diagram illustrating the use of the invention in connection with a conventional liquid crystal display.

FIG. 9 shows that a further implementation of the invention in an everyday practical application, in this case the driver electronics for a liquid crystal display, such as that utilized in laptop computers. The display screen is shown at 250 and is shown to be divided into a plurality of pixels. Thin film transistor driver electronics are formed directly on the LCD substrate. An array of row driver electronics is indicated in the cross-hatched portion 251, an array of column driver electronics is indicated in the cross-hatched portion 252, and local memory and decoding circuitry is indicated in the cross-hatched portion 253. Shown below the screen are the thin film transistor devices capable of performing in this application.

In the implementation of FIG. 9, the thin film transistors are formed directly on the LCD substrate indicated at 260.

In conventional liquid crystal technology, the substrate 260 will be rigid, such as a glass sheet. The FIG. 9 embodiment shows that the thin film technology can be deposited on a rigid substrate, although maximum advantage is taken when the substrate is thin and flexible. However, in a case such as FIG. 9 where a significant amount of electronics is required for driving the individual pixels, they can be deposited directly along the edges of the rigid substrate in the areas 251–253.

The left-hand portion 255 of the circuit structure of FIG. 9 is representative of the circuitry which is deposited in the area 253. The area 253 is configured as local memory, and the circuit elements 255 are illustrated as floating gate transistors capable of functioning as the local memory elements.

The driver areas 251 and 252 are configured to include at least a driver transistor 256 and in many applications an associated memory transistor 257. The memory may be used for applications where only portions of the display change at any given time, so that continual raster-like scanning can be avoided. More particularly, many displays are configured to be continually refreshed, and thus the display is scanned at a relatively high rate, and every pixel is rewritten on every scan. However, when memory is possible in the display drivers, the display can be operated so that it is only refreshed in the areas where the display needs to be changed. The memory configuration in the driver provided by this application is very advantageous in providing a ready hardware implementation for displays which restrict display refresh to the areas where the display is to be changed.

Thus, the memory transistor can be written and then altered as the display is updated, but left in the altered condition until the the next change, when the non-continual refresh operation is desired.

In any event, whether or not a memory transistor 257 is utilized in the row or column drivers 251, 252, each has a driver transistor such as illustrated at 256. The driver transistor supplies drive current to the row or to the column, and the intersection between one of the row grid lines from driver 251 and one of the column grid lines from driver 252 will cause the illumination of a particular pixel.

The display can be scanned in a conventional fashion (with or without the associated memory 257), and the driver transistors 256 will cause the individual pixels to be illuminated or not to drive the display as is conventional. However, as is not conventional, the driving electronics are formed right on the same substrate as the liquid crystal display element to make up a unitary assemblage. That is in contrast to displays which utilize conventional semiconductor technology, requiring individual integrated circuits to be installed on printed circuit boards and interconnected with each other and then with the liquid crystal display itself.

The practical implementation of FIG. 8 illustrates one use of the invention which takes advantage of the flexibility of the thin film transistor circuitry of the present invention. The three-dimensional stacks of FIGS. 6 and 7 also illustrate applications which can be satisfied by the technology according to the present invention, whereas they are more difficult of satisfaction by conventional technology. The FIG. 9 application takes advantage of the ability of the invention to utilize a variety of substrate materials.

In a concurrently-filed application assigned to the same assignee of the present invention (Docket No. 62828), there is disclosed a light-emitting polymer display associated with thin film transistor technology according to the present invention for providing display capabilities in certain applications. For example, a data card such as illustrated in FIG. 8 can have its own display associated therewith as is described more completely in the aforementioned application. Other end use applications can be readily satisfied, including flexible substrate display devices (such as for cockpit instrumentation in high performance aircraft), transparent displays such as virtual reality helmets, and the like. Circuits according to the present invention are also radiation tolerant since they are formed on an insulating substrate. The connectivity between layers illustrated in FIGS. 6 and 7 provides the basis for using circuits according to the present invention in highly interconnected neural networks and similar circuitry.

Figure 12:
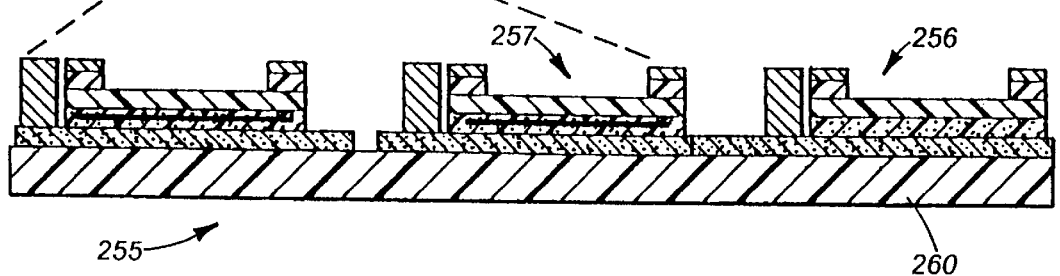
FIG. 12 is a diagram illustrating a roll-to-roll process useful in fabricating thin film transistors according to the present invention.
Figure 12:
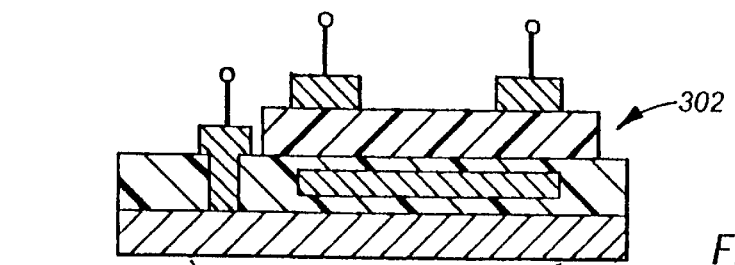
Figure 10:
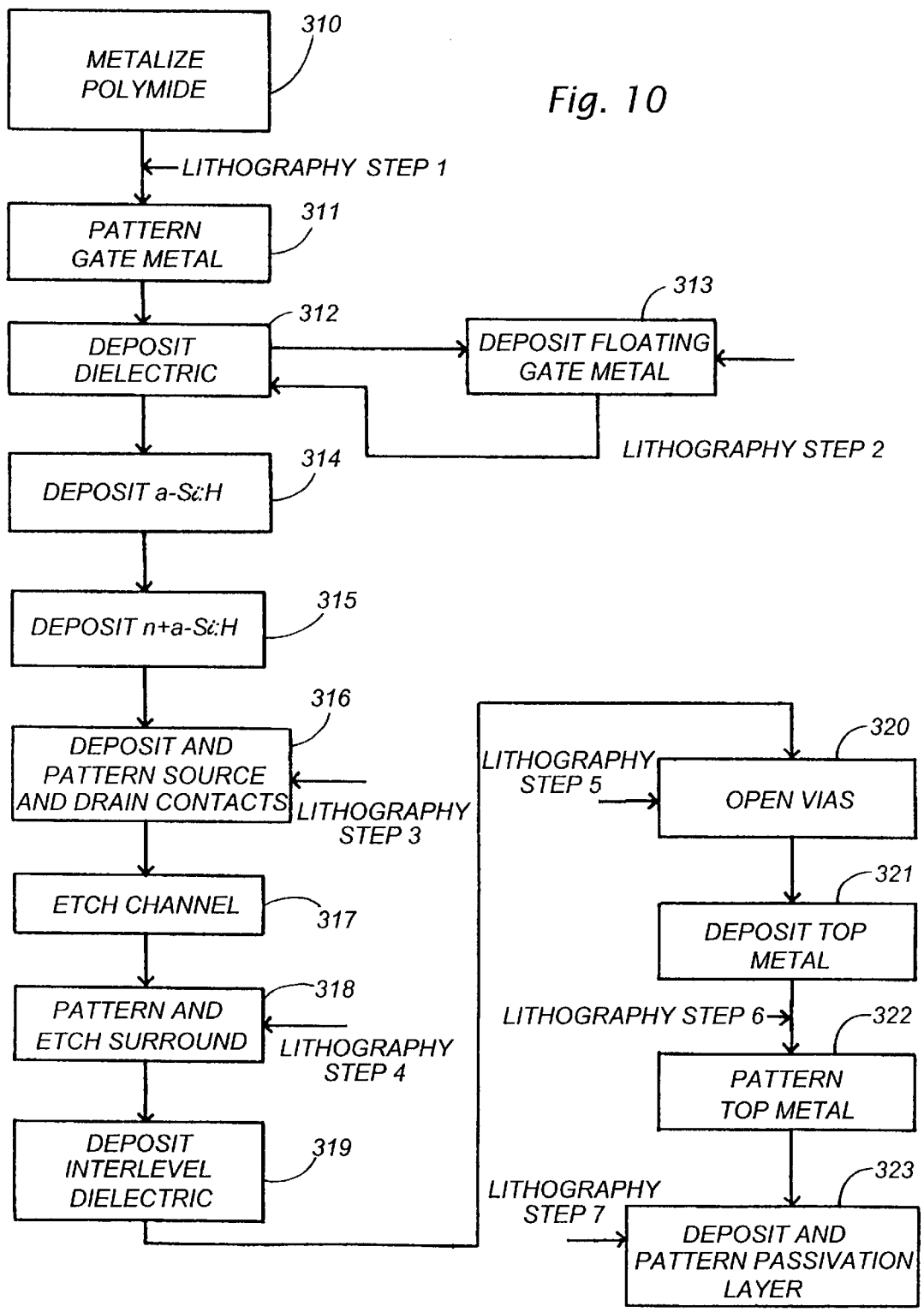
FIG. 10 is a flow diagram illustrating the process steps for forming thin film transistors according to the present invention.

A currently preferred process for fabrication of devices according to the present invention is illustrated in connection with the flow chart of FIG. 10 and with the schematic cross-sectional flow diagrams of FIGS. 11A–11L. FIGS. 10 and 11 relate to the same process except at the very beginning. In the beginning of FIG. 10, the process is commenced on a dielectric film, such as a sheet of film. FIG. 12 schematically shows the application of a roll-to-roll process in which a pair of rolls 300, 301 are used as supply and take-up rolls for a polyimide film which is processed according to the steps of FIGS. 10 or 11 to form devices of the type generally illustrated at 302. The manner in which the lithography deposition equipment and the like is associated with the roll-to-roll process will not be further described herein. What is important is the actual processes as they are performed on the substrate.

Figure 11A:
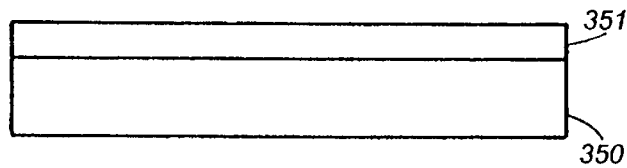
FIGS. 11A to 11L illustrate formation of a thin film transistor device at various stages of processing, in accordance with the present invention.

As noted above, FIG. 10 begins with a polyimide sheet such as is illustrated in FIG. 12. By way of contrast, the FIG. 11 flow starts with FIG. 11A showing a silicon wafer 350 on which a polyimide or epoxy film 351 is spun on and baked to form a thin, smooth insulating film 351 over the silicon wafer 350. The film is deposited in a way which allows the polyimide film to be stripped from the silicon wafer at the end of processing to provide an amorphous silicon thin film transistor device on a thin flexible insulating sheet. In the process, the silicon wafer is used simply as a rigid support for the device which is readily accommodated in conventional semiconductor process equipment.

Figure 11B:
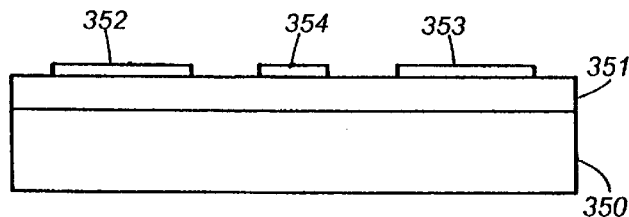
Figure 11C:
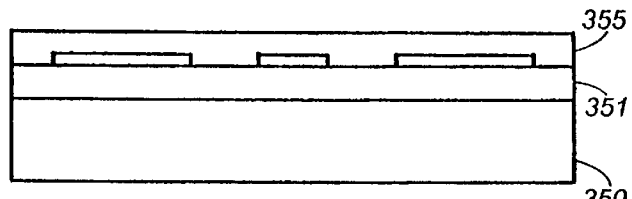

FIG. 11B illustrates the deposition and formation of the lower metallization on the insulating substrate. Formation of the chromium gates and lower metallization is also illustrated in the FIG. 10 flowchart. A first step 310 is performed to metallize the polyimide or insulating substrate. Such metallization is by electron beam evaporation of chromium to produce a layer of approximately 500 angstroms. The gate metal is then patterned in a step 311. Patterning entails a first lithographic step for masking of the gate metal to expose only those areas which are to form control gates for thin film transistors and lower metallization interconnects. Following the lithographic patterning step, the unmasked metal is removed by a wet etching process to produce a device such as illustrated in FIG. 11B, having control gates 352, 353 and interconnecting metallization 354.

Figure 11D:
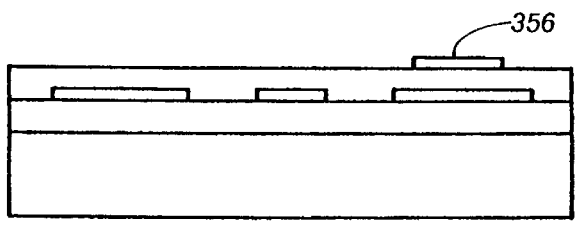
Figure 11E:
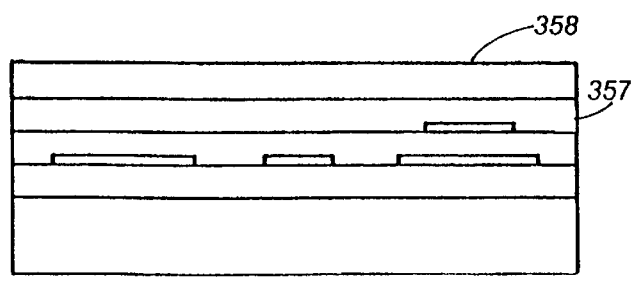

A dielectric layer is then deposited over the lower metallization layer. Particularly when used with devices in which some of the transistors will be floating gate transistors, it is preferred to use a two-layer dielectric, with the first layer encapsulating the floating gate, and a second layer interposed between the first layer and the amorphous silicon for providing a defect-free interface with the amorphous silicon. In practice, the first layer is formed of two layers, preferably of the same material, as is illustrated by comparison of FIGS. 11C, 11D and 11E. As will be seen, a first oxide layer 355 is deposited which is preferably silicon dioxide. The deposition is preferably by means of plasma-enhanced chemical vapor deposition utilizing $SiH_4$ and $N_2O$ at a temperature of about 275° and at low power levels. A layer thickness of about 300 angstroms is produced, after which the floating metal gate is deposited on the partially completed dielectric layer. The floating gate 356 is preferably of aluminum formed by electron beam evaporation to a thickness of 200 to 300 angstroms. The floating gate 356 is then patterned in a second lithographic step as illustrated in FIG. 11D and as represented by the process step 313 of FIG. 10. The deposit dielectric step 312 is then completed as shown in FIG. 11E by depositing the remaining layer 357 of the oxide to encapsulate the floating gate, followed by an upper interface dielectric layer 358 adapted for interface with the amorphous silicon.

The interface dielectric is preferably silicon nitride, $Si_xN_y$, also deposited by plasma-enhanced chemical vapor deposition, without breaking vacuum from the deposition of the oxide layer 357. The chemistry utilizes $SiH_4$ and $NH_3$, and the deposition temperature is held at about 275° C. The nitride film is deposited to a thickness of about 400 angstroms.

Figure 11F:
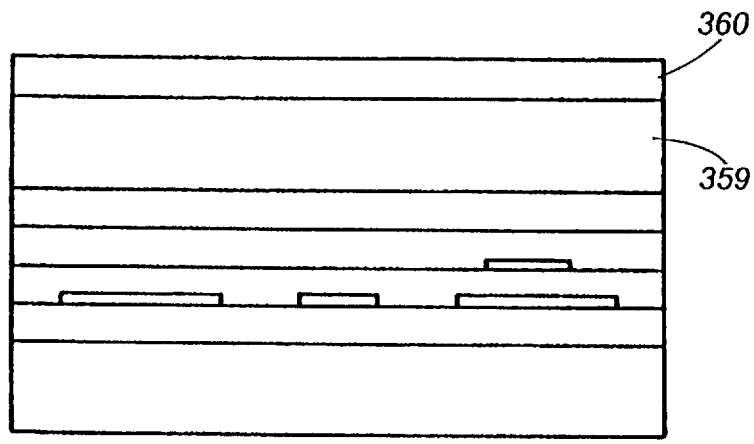
Figure 11G:
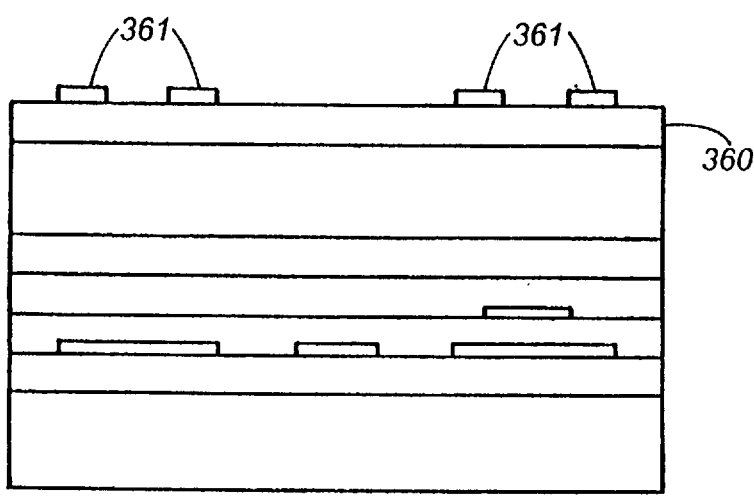
Figure 11H:
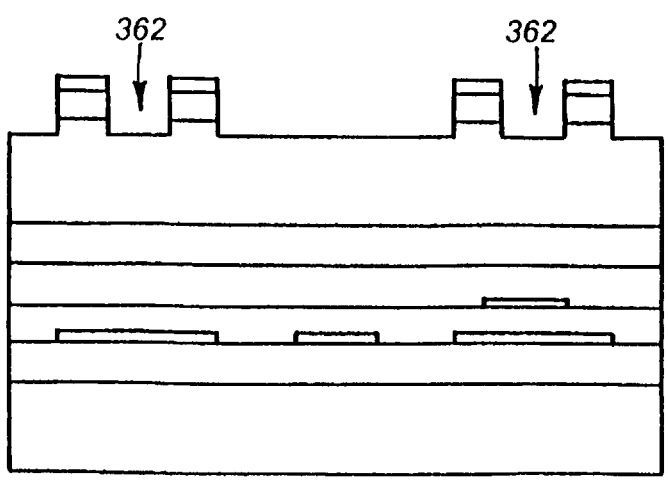

Following deposition of the dielectric layer, the active amorphous silicon layer is then deposited directly on the dielectric. As shown in FIG. 11F, undoped layer 359 of α-Si:H (approximately 1200 angstroms), is deposited from the decomposition of $SiH_4$ (10%) in $H_2$ at a pressure of about 300 mT and a temperature of about 275° C. (step 314 of FIG. 10). A dopant is then added to the atmosphere to produce a doped layer 360 also of amorphous silicon (step 315 of FIG. 10). The doping is accomplished by adding $PH_3$ (at about a 10% concentration) to the materials which had been used to form the layer 359 for the final few minutes of growth. The other deposition conditions remain the same. After completion of the deposition of the amorphous silicon layer 360, which will form the source and drain regions of the field effect transistors, chromium caps are formed on the surface of the layer 360. The caps are formed in a step 316 (FIG. 10). First of all, a thin chromium layer of about 1000 angstroms is deposited on the doped amorphous silicon as by electron beam evaporation. The metal layer is then masked and lithographically patterned (in a third lithographic step) followed by a wet etch which produces the chromium caps 361 shown in FIG. 11G. The chromium caps are then used (step 317, FIG. 10) to define the channel between the source and drain regions. The chromium caps are used as a mask for a reactive ion etch using the chemistry $CHF_3+O_2$. Etching continues until approximately 30% of the total thickness of the silicon layer is removed, thus assuring that the channel etches completely through the doped material and somewhat into the undoped layer. The region between the source and drain regions is the channel of the thin film transistor. Utilizing 2 micron technology, where 2 microns is the minimum feature size, that minimum feature size is usually the distance between the source and drain regions which forms the channel. In FIG. 11H, the channel region is denoted by the reference numeral 362.

Figure 11I:
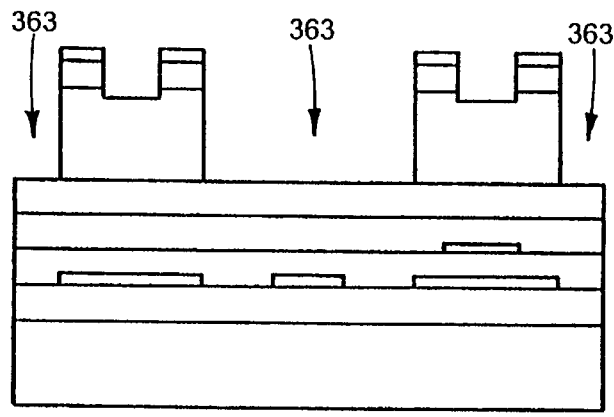

In accordance with an important aspect of the present invention, the partly completed device is then processed to produce trenches 363 around the individual devices such that leakage between devices will not be a problem even with devices very closely spaced. In addition, the isolation provided by the trenching prevents noise from propagating through the circuit. FIG. 11I shows the formation of a surround 363 by removal of the amorphous silicon between devices (completely surrounding the devices), the etch being continued until the underlying dielectric layer 358 is reached. The surround mask represents the fourth lithographic step and is illustrated at 318 in FIG. 10. The etching is preferably a reactive ion etch with the chemistry $CHF_3$ and $O_2$. It is necessary in this case to use a timed etch, but since there is a relatively thick dielectric layer below the amorphous silicon, the timing can be handled without great criticality.

Figure 11J:
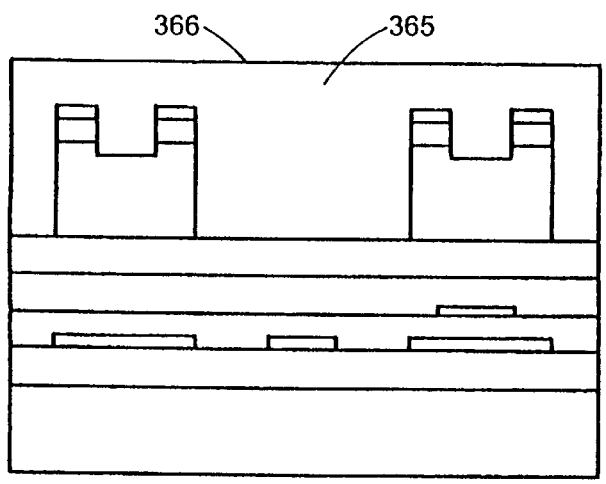
Figure 11K:
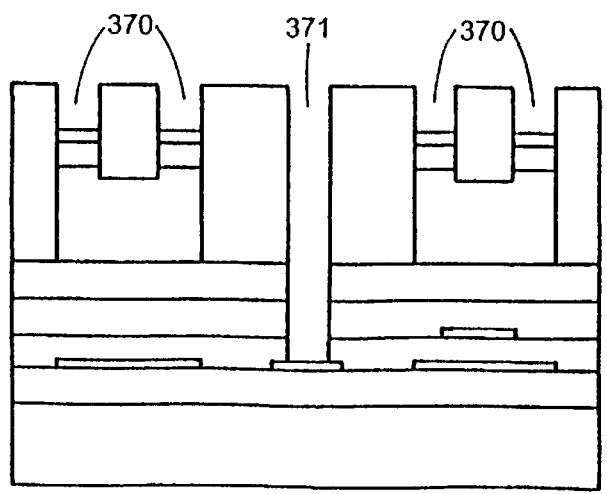

Following the isolation of the individual devices as illustrated in FIG. 11I, an oxide inter-level dielectric 365 is then deposited over the entire device as shown in FIG. 11J, and at step 319 in FIG. 10. The oxide dielectric layer 365 provides a relatively smooth planar surface 366 for further processing of the device. The next step in processing will of course be to form interconnections to the partly completed semiconductor devices which are now encapsulated in the oxide inter-level dielectric 365. That is accomplished as shown in FIG. 11K by forming vias which reach to the metallization at which electrical connections are to be made. The opening of via step in FIG. 10 is illustrated at 320. In order to form the vias, a fifth lithography step is utilized to pattern openings over the areas where contacts are to be made, that is, over the chromium contacts at the source and drain of the transistors and any gate contacts in the lower metallization layer. Following the deposition and processing of the mask (the fifth lithography step), a reactive ion etch removes the inter-level dielectric as well as the gate dielectric where present, using the chromium contacts as etch stops. Thus, it will be seen that relatively short vias 370 are formed at the source and drain of the transistors whereas a relatively longer via 371 is formed down to the lower metallization layer for connection to one of the gate contacts. The chemistry of the etch is $CHF_3$ and $O_2$, and the chromium contacts adequately act as an etch stop, such that the etch need not be timed, and it can continue through the respective depths until completed.

Figure 11L:
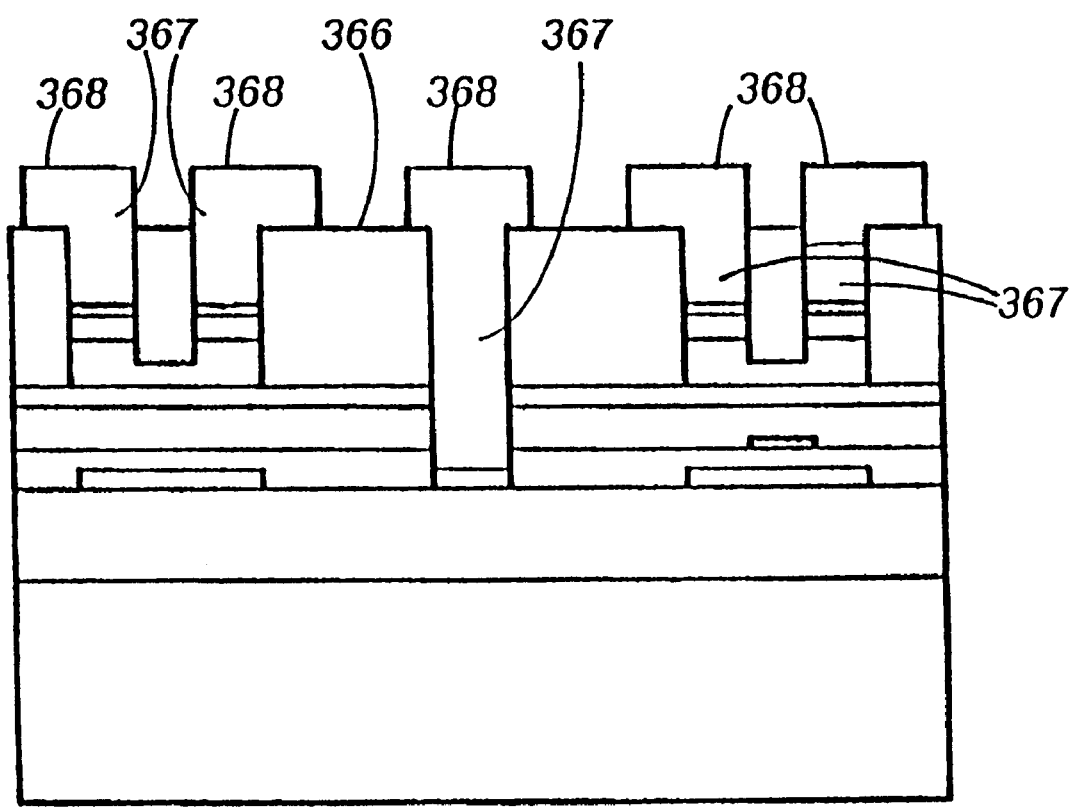

After formation of the vias, metallization and contacts for the top metal are formed. Preferably, conventional sputtering techniques are used to deposit aluminum with a slight (1%) concentration of silicon to a thickness of about 2500 angstroms. The aluminum fills the vias at 367 and also covers the surface 366 of the inter-level dielectric. After the aluminum is deposited, it is patterned and etched to provide contacts and other top metal interconnections 368. FIG. 11L illustrates the device with the top metal contacts thus formed. It will be seen that the vias are in electrical contact with the chromium caps but otherwise insulated either by the oxide level dielectric 365 or the intermediate dielectric layers 356–358. The amorphous silicon has been removed by virtue of the inter-level dielectric, and electrical contact between the metal in the vias and the amorphous silicon is thereby avoided. The patterning of the dielectric metal requires a sixth lithographic step and is represented in FIG. 10 by the steps 321, 322.

Normally, a passivation layer is deposited over the metal interconnects, and the passivation layer is patterned and etched in order to expose only the contact areas of the circuit which are to be available for later connection. That final step in the process is illustrated at 323 of FIG. 10. The patterning of the passivation layer is a seventh lithographic step associated with the process. The polyimide with a firmly attached semiconductor device is then stripped from the silicon wafer to form a thin film transistor device on insulating flexible polyimide substrate as illustrated earlier in FIG. 3 of the drawings.

Particular note was made of the lithographic steps in the foregoing process description, because their number is rather severely and intentionally limited considering the complexity of the process. Furthermore, the temperature conditions used in the process are limited to approximately 350° C. maximum, usually below 300° C. maximum, such that they are entirely compatible with the polyimide substrate. These mild processing conditions and the limited number of lithographic steps render the process suitable for adaption to the roll-to-roll process suggested in FIG. 12. The low temperature processing also makes possible the practical implementation of multi-layer devices such as those illustrated in FIG. 6.

It will now be appreciated that what has been provided is an improved thin film transistor on insulator semiconductor device in which a large number of small feature size semiconductor devices can be formed in a very small area on an insulating substrate and interconnected to form basic building blocks. Since the insulating substrate is and can be flexible, devices can be formed which are very large. The ability to form multi-layer interconnect levels or multi-layer devices allows a topology in which a very large number of building blocks and individual devices can be connected to form VLSI and ULSI circuits. The trenching between individual devices which allows the tight packing in combination with the steps which continue to planarize the surface to allow further processing provides the basis for highly complex circuits having electrical operating characteristics compatible with the needs for certain very large scale devices, such as high quality computer displays, very large scale memories and the like.

What is claimed is:

1. A method of fabricating a thin film semiconductor circuit including a plurality of thin film transistors at least some of which are floating gate thin film transistors in a high density integrated circuit configuration comprising the steps of:

depositing and patterning a lower metallization layer of chromium in which the pattern includes formation of control gates for the thin film transistors and at least some interconnections and contacts for the control gates;

depositing a dielectric layer on the patterned chromium layer with metallic floating gates embedded in at least some of the transistors over the control gates in the formation of the floating gate transistors;

depositing a layer of $\alpha$-Si:H and doping the top portion of the layer to form source and drain regions for the thin film transistors;

depositing and patterning chromium caps over the source and drain regions;

using the chromium caps as an etching mask, etching channels in the thin film transistors by removing the doped portion of the layer between the source and drain regions;

patterning and etching isolating trenches around the transistors by removing the amorphous silicon layer between transistors;

filling the trenches with an insulating layer to form a planar surface;

patterning the surface and etching to the chromium caps and chromium contacts in the lower metallization using the chromium as an etch stop; and depositing metal connections in the etched vias to form connections with the chromium caps and also to form an interconnecting metallization layer on said planar surface.

2. The method of claim 1 further comprising the steps of:

spinning on a polyimide film on a silicon wafer;

baking the polyimide film to form a thin, smooth insulating film over the silicon wafer; and wherein said step of depositing and patterning a lower metallization layer deposits the lower metallization layer on the polyimide film.

3. The method of claim 1 further comprising the step of stripping the polyimide film from the silicon wafer to provide an amorphous silicon thin film transistor on a thin flexible insulating sheet.

4. The method of claim 1 wherein said step of depositing a lower metallization layer is accomplished by electron beam evaporation of chromium for a period of time sufficient to deposit a layer of approximately 500 angstroms.

5. The method of claim 1 wherein said step of patterning a lower metallization layer comprises the steps of:

masking the metallization layer to expose only those areas which are to form control gates and lower metallization interconnects; and removing the unmasked metal by a wet etching process.

6. The method of claim 1 wherein said step of depositing a dielectric layer comprises the steps of:

depositing a first dielectric layer encapsulating the metallic floating gates; and depositing a second dielectric layer interposed between the first layer and the amorphous silicon, the second dielectric layer providing a substantially defect free interface with the amorphous silicon.

7. The method of claim 6 wherein the step of depositing the first dielectric layer comprises the steps of:

depositing a first oxide layer;

depositing the metallic floating gate;

patterning the metallic floating gate; and depositing a second oxide layer thereby encapsulating the metallic floating gate.

8. The method of claim 7 wherein the step of depositing the first and the second oxide layers comprise the steps of utilizing plasma-enhanced chemical vapor disposition at a temperature of about 275° C. for a period sufficient to deposit the oxide layer to a thickness of about 300 angstroms.

9. The method of claim 7 wherein the step of depositing the metallic floating gate comprises the step of evaporating aluminum through an electron beam evaporation process for a period sufficient to deposit the metallic floating gate to a thickness of between 200 to 300 angstroms.

10. The method of claim 6 wherein the step of depositing a second oxide layer comprises the step of depositing silicon nitride, $Si_xN_y$, by plasma-enhanced chemical vapor deposition at a temperature of about 275° C.

11. The method of claim 10 wherein the step of depositing by plasma-enchanced chemical vapor disposition is accomplished without breaking vacuum from the step of deposition of the first oxide layer.

12. The method of claim 6 wherein the step of depositing the second oxide layer is performed for a time sufficient to deposit the silicon nitride to a thickness of about 400 angstroms.

13. The method of claim 1 wherein said step of depositing a layer of $\alpha$-SI:H is performed for a time sufficient to deposit a layer of $\alpha$-SI:H to a thickness of approximately 1,200 angstroms.

14. The method of claim 1 wherein the step of depositing a layer of $\alpha$-SI:H comprises the step of decomposition of $SiH_4$ (10%) in $H_2$ at a pressure of about 300 mT and a temperature of about 275° C.

15. The method of claim 1 wherein the step of doping the top portion of the α-SI:H layer comprises the step of adding $PH_3$ at about a 10% concentration to the α-SI:H for the final few minutes of growth of the α-SI:H layer.

16. The method of claim 1 wherein the step of depositing and patterning chromium caps over the source and drain regions comprises the steps:

depositing a thin chromium layer on the doped top portion of the α-SI:H layer;

masking and lithographically patterning the thin chromium layer; and wet etching the patterned chromium layer to produce the chromium caps.

17. The method of claims 1 wherein the step of etching channels in the thin film transistors is performed until approximately 30% of the total thickness of the α-SI:H layer is removed thus assuring that the channel etches completely through the doped top portion of the layer and somewhat into the undoped portion of the layer.

18. The method of claim 1 wherein the step of etching isolating trenches around the transistors is continued until the underlying dielectric layer is reached.

19. The method of claim 1 wherein the step of etching isolating trenches is timed utilizing a reactive ion etch with the chemistry $CHF_3$ and $O_2$.

20. The method of claim 1 wherein the step of depositing metal connections in the etched vias comprises the steps of:

sputtering aluminum with a slight concentration of silicon to a thickness of about 2,500 angstroms, filling the vias and covering the surface of an inner level dielectric;

patterning and etching the aluminum to provide contacts and other top metal interconnections.

21. The method of claim 1 further comprising the step of depositing a passivation layer over the metal interconnections.

22. The method of claim 11 further comprising the step of patterning and etching the passivation layer to expose only the contact areas of the thin film semiconductor circuit.

23. The method of claim 1 limiting a temperature condition to approximately 350° C. maximum.

24. The method of claim 23 wherein the step of limiting the temperature conditions is performed to maintain the temperature conditions below 300° C. maximum.

* * * * *